United States Patent
Stowell

(10) Patent No.: US 10,685,812 B2
(45) Date of Patent: *Jun. 16, 2020

(54) WORKPIECE PROCESSING CHAMBER HAVING A ROTARY MICROWAVE PLASMA ANTENNA WITH SLOTTED SPIRAL WAVEGUIDE

(71) Applicant: Applied Materials, Inc., Santa Clara, CA (US)

(72) Inventor: Michael W. Stowell, Loveland, CO (US)

(73) Assignee: Applied Materials, Inc., Santa Clara, CA (US)

( * ) Notice: Subject to any disclaimer, the term of this patent is extended or adjusted under 35 U.S.C. 154(b) by 110 days.

This patent is subject to a terminal disclaimer.

(21) Appl. No.: 15/907,102

(22) Filed: Feb. 27, 2018

(65) Prior Publication Data

US 2018/0190472 A1 Jul. 5, 2018

Related U.S. Application Data

(63) Continuation of application No. 14/609,883, filed on Jan. 30, 2015, now Pat. No. 9,928,993.

(60) Provisional application No. 62/100,595, filed on Jan. 7, 2015.

(51) Int. Cl.
 *H01J 37/32* (2006.01)
 *H01Q 13/22* (2006.01)

(52) U.S. Cl.
 CPC .... *H01J 37/3222* (2013.01); *H01J 37/32192* (2013.01); *H01J 37/32229* (2013.01); *H01Q 13/22* (2013.01)

(58) Field of Classification Search
 USPC .............................. 156/345.41; 118/723 MW
 See application file for complete search history.

(56) References Cited

U.S. PATENT DOCUMENTS

| | | | |
|---|---|---|---|
| 5,028,897 | A | 7/1991 | Gartner |
| 5,134,965 | A | 8/1992 | Tokuda |
| 5,646,489 | A | 7/1997 | Kakehi |
| 7,210,424 | B2 | 5/2007 | Tolmachev et al. |
| 9,928,993 | B2 | 3/2018 | Stowell |
| 2001/0019237 | A1* | 9/2001 | Ishii ................. H01J 37/32192 313/231.31 |

(Continued)

FOREIGN PATENT DOCUMENTS

| | | |
|---|---|---|
| CN | 1576392 | 2/2005 |
| CN | 101043786 | 9/2007 |

(Continued)

OTHER PUBLICATIONS

Chinese Office Action in Chinese Application No. 201580072027.4, dated Sep. 3, 2018, 13 pages (English Translation).

(Continued)

*Primary Examiner* — Rakesh K Dhingra
(74) *Attorney, Agent, or Firm* — Fish & Richardson P.C.

(57) ABSTRACT

A microwave antenna includes a first spiral conduit having a first conduit end, first plural ports in a floor of the first spiral conduit spaced apart along the length of the first spiral conduit; an axial conduit coupled to a rotatable stage; and a distributor waveguide comprising an input coupled to the axial conduit and a first output coupled to the first conduit end.

21 Claims, 5 Drawing Sheets

(56) References Cited

U.S. PATENT DOCUMENTS

| | | |
|---|---|---|
| 2004/0026039 A1 | 2/2004 | Goto |
| 2004/0027302 A1 | 2/2004 | Ishii |
| 2005/0005854 A1 | 1/2005 | Suzuki |
| 2009/0045749 A1 | 2/2009 | Ganachev |
| 2009/0242130 A1 | 10/2009 | Tian |
| 2010/0307684 A1 | 12/2010 | Ota et al. |
| 2011/0005461 A1 | 1/2011 | Vandermeulen |
| 2012/0222816 A1 | 9/2012 | Ikeda et al. |
| 2012/0241090 A1 | 9/2012 | Yoshikawa et al. |
| 2013/0011578 A1 | 5/2013 | Matsumoto et al. |

FOREIGN PATENT DOCUMENTS

| | | |
|---|---|---|
| CN | 102260861 | 11/2011 |
| JP | S52-023743 | 2/1977 |
| JP | H02-147847 A | 6/1990 |
| JP | H3-262119 A | 11/1991 |
| JP | H6-236799 A | 8/1994 |
| JP | H7-90591 | 4/1995 |
| JP | 2000-150195 | 5/2000 |
| JP | 2001-345312 | 12/2001 |
| JP | 2005-19968 A | 1/2005 |
| JP | 2007-042333 | 2/2007 |
| JP | 20101 18549 A | 5/2010 |
| JP | 2013-33908 A | 2/2013 |
| JP | 2013033908 A | 4/2013 |
| KR | 2012-133969 | 12/2012 |
| TW | 520620 | 2/2003 |

OTHER PUBLICATIONS

Taiwan Office Action in Application No. 104138344, dated Oct. 26, 2019 (with English Search Report).

Machine Translation KR 2012133969_1020110088471, Lee et al dt Dec. 2012.

Office Action in Japanese Application No. 2017-536006, dated Jul. 23, 2019, 8 pages (with English translation).

JP Office Action in Japanese Application No. 2017-536006 dated Dec. 10, 2019, 5 pages (with English Translation).

\* cited by examiner

WORKPIECE PROCESSING CHAMBER HAVING A ROTARY MICROWAVE PLASMA ANTENNA WITH SLOTTED SPIRAL WAVEGUIDE

CROSS-REFERENCE TO RELATED APPLICATIONS

This application is a continuation of U.S. application Ser. No. 14/609,883, filed Jan. 30, 2015, which claims benefit of U.S. Provisional Application Ser. No. 62/100,595, filed Jan. 7, 2015, the disclosures of which are incorporated by reference.

BACKGROUND

Technical Field

The disclosure concerns a chamber or reactor for processing a workpiece such as a semiconductor wafer using microwave power.

Description of Related Art

Processing of a workpiece such as a semiconductor wafer can be carried out using a form of electromagnetic energy, such as RF power or microwave power, for example. The power may be employed, for example, to generate a plasma, for carrying out a plasma-based process such as plasma enhanced chemical vapor deposition (PECVD) or plasma enhanced reactive ion etching (PERIE). Some processes need extremely high plasma ion densities with extremely low plasma ion energies. This is true for processes such as deposition of diamond-like carbon (DLC) films, where the time required to deposit some type of DLC films can be on the order of hours, depending upon the desired thickness and upon the plasma ion density. A higher plasma density requires higher source power and generally translates to a shorter deposition time.

A microwave source typically produces a very high plasma ion density while producing a plasma ion energy that is less than that of other sources (e.g., an inductively coupled RF plasma source or a capacitively coupled RF plasma source). For this reason, a microwave source would be ideal. However, a microwave source cannot meet the stringent uniformity required for distribution across the workpiece of deposition rate or etch rate. The minimum uniformity may correspond to a process rate variation across a 300 mm diameter workpiece of less than 1%. The microwave power is delivered into the chamber through a microwave antenna such as a waveguide having slots facing a dielectric window of the chamber. Microwaves propagate into the chamber through the slots. The antenna has a periodic power deposition pattern reflecting the wave pattern of the microwave emission and the slot layout, rendering the process rate distribution non-uniform. This prevents attainment of the desired process rate uniformity across the workpiece.

A limitation on processing rate is the amount of microwave power that can be delivered to a process chamber without damaging or overheating the microwave window of the chamber. Currently, a microwave window, such as a quartz plate, can withstand only low microwave power levels at which DLC deposition processes can require hours to reach a desired DLC film thickness. The microwave window provides a vacuum boundary of the chamber and is consequently subject to significant mechanical stress, rendering it vulnerable to damage from overheating.

SUMMARY

A reactor for processing a workpiece comprises: a chamber and a workpiece support surface in the chamber; a rotary coupling comprising a stationary stage and a rotatable stage having an axis of rotation; a microwave source coupled to the stationary stage; a rotation actuator; a microwave antenna coupled to the rotation actuator and overlying the workpiece process chamber, the microwave antenna comprising: a floor and a ceiling; a first spiral wall extending between the floor and the ceiling and having a spiral axis corresponding to the axis of rotation, the first spiral wall defining a first spiral conduit having a first conduit end; first plural ports in the floor spaced apart along the length of the first spiral conduit; an axial conduit coupled to the rotatable stage; and a distributor waveguide comprising an input coupled to the axial conduit and a first output coupled to the first conduit end.

In one embodiment, the microwave antenna further comprises: a second spiral wall extending between the floor and the ceiling and aligned with the spiral axis, the second spiral wall defining a second spiral conduit having a second conduit end; second plural ports in the floor spaced apart along the length of the second spiral conduit; wherein the distributor waveguide further comprises a second output coupled to the second conduit end.

In one embodiment, the distributor waveguide comprises: a waveguide chamber overlying the microwave antenna and having respective openings aligned with respective ones of the first and second conduit ends; and a first pair of reflective surfaces angled to deflect radiation in the waveguide chamber into the respective openings. In one embodiment, the microwave antenna further comprises: a second pair of reflective surfaces angled to deflect radiation from the respective openings to respective ones of the first and second conduit ends.

In one embodiment, the first pair of reflective surfaces are oriented at 45 degrees relative to the axis of symmetry. In one embodiment, the second pair of reflective surfaces are oriented at 45 degrees relative to the axis of symmetry.

In one embodiment, the first and second conduit ends are at a periphery of the microwave antenna, the distributor waveguide spanning a diameter of the microwave antenna. In a related embodiment, the respective openings are displaced from one another by 180 degrees along the periphery.

In accordance with a further aspect, a microwave source comprises: a floor and a ceiling; a first spiral wall defining a first spiral conduit and extending between the floor and the ceiling and having a spiral axis and a first conduit end; first plural ports in the floor spaced apart along the length of the first spiral conduit; an axial conduit; and, a distributor waveguide comprising an input coupled to the axial conduit and a first output coupled to the first conduit end.

In one embodiment, the source further comprises: a rotary coupling comprising a stationary stage and a rotatable stage having an axis of rotation coinciding with the spiral axis; a microwave source coupled to the stationary stage, the axial conduit coupled to the rotatable stage; and a rotation actuator coupled to the rotatable stage.

In one embodiment, the source further comprises: a second spiral wall extending between the floor and the ceiling and aligned with the spiral axis, the second spiral wall defining a second spiral conduit having a second conduit end; second plural ports in the floor spaced apart along the length of the second spiral conduit; and wherein the distributor waveguide further comprises a second output coupled to the second conduit end.

In one embodiment, the distributor waveguide comprises: a waveguide chamber having respective openings aligned with respective ones of the first and second conduit ends; and a first pair of reflective surfaces angled to deflect radiation in the waveguide chamber into the respective openings.

In one embodiment, the source further comprises: a second pair of reflective surfaces angled to deflect radiation from the respective openings to respective ones of the first and second conduit ends.

In one embodiment, the first pair of reflective surfaces are oriented at 45 degrees relative to the axis of symmetry, and the second pair of reflective surfaces are oriented at 45 degrees relative to the axis of symmetry.

In one embodiment, the first and second conduit ends are one opposite sides of a periphery of the source. In one embodiment, the respective openings are displaced from one another by 180 degrees along the periphery.

In accordance with another aspect, a reactor comprises: a workpiece processing chamber; a first spiral waveguide conduit overlying the workpiece processing chamber and having a spiral axis and a first conduit end; first plural ports in the first spiral waveguide conduit facing the workpiece processing chamber and spaced apart along the length of the first spiral waveguide conduit; an axial conduit; and a distributor waveguide comprising an input coupled to the axial conduit and a first output coupled to the first conduit end.

In one embodiment, the reactor further comprises: a rotary coupling comprising a stationary stage and a rotatable stage having an axis of rotation coinciding with the spiral axis; a microwave source coupled to the stationary stage, the axial conduit coupled to the rotatable stage; and a rotation actuator coupled to the rotatable stage.

In one embodiment, the reactor further comprises: a second spiral waveguide conduit aligned with the spiral axis, the second spiral conduit having a second conduit end; second plural ports in the second spiral waveguide conduit spaced apart along the length of the second spiral conduit; and wherein the distributor waveguide further comprises a second output coupled to the second conduit end.

BRIEF DESCRIPTION OF THE DRAWINGS

So that the manner in which the exemplary embodiments of the present invention are attained can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1A:
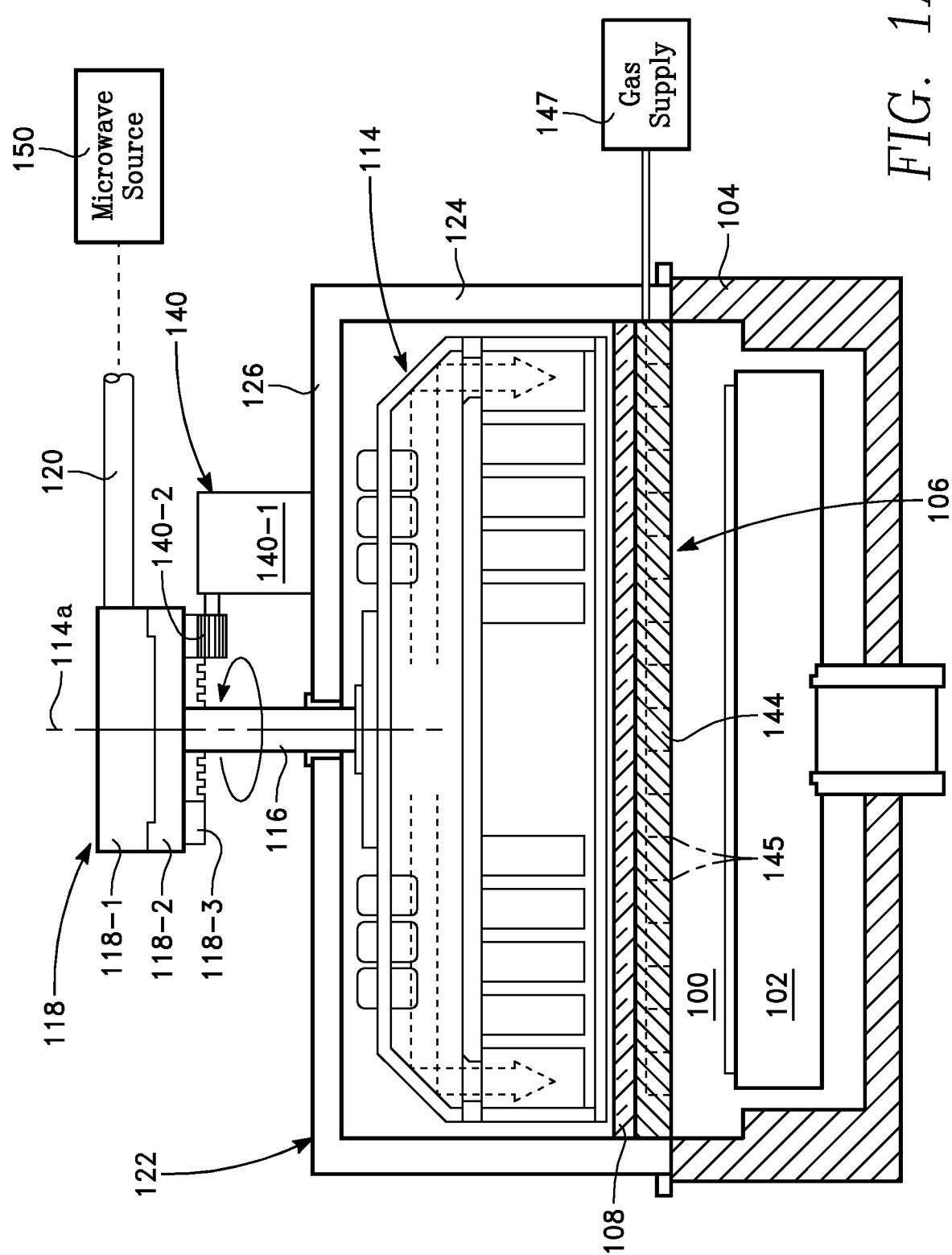
FIG. 1A is a cut-away elevational view of a first embodiment.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Figure 1B:
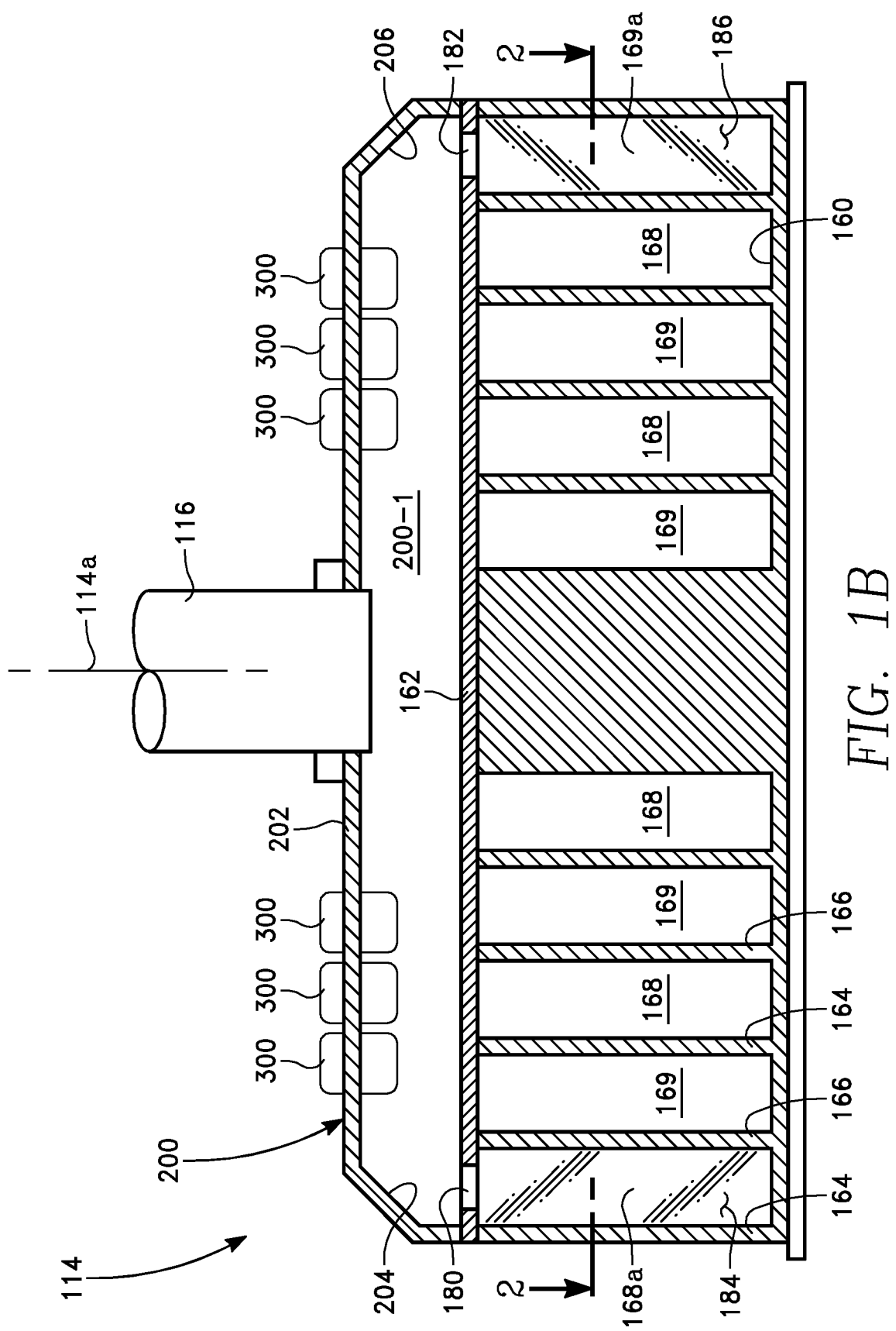
FIG. 1B is an enlarged view of a microwave antenna in the embodiment of FIG. 1A.
Figure 2:
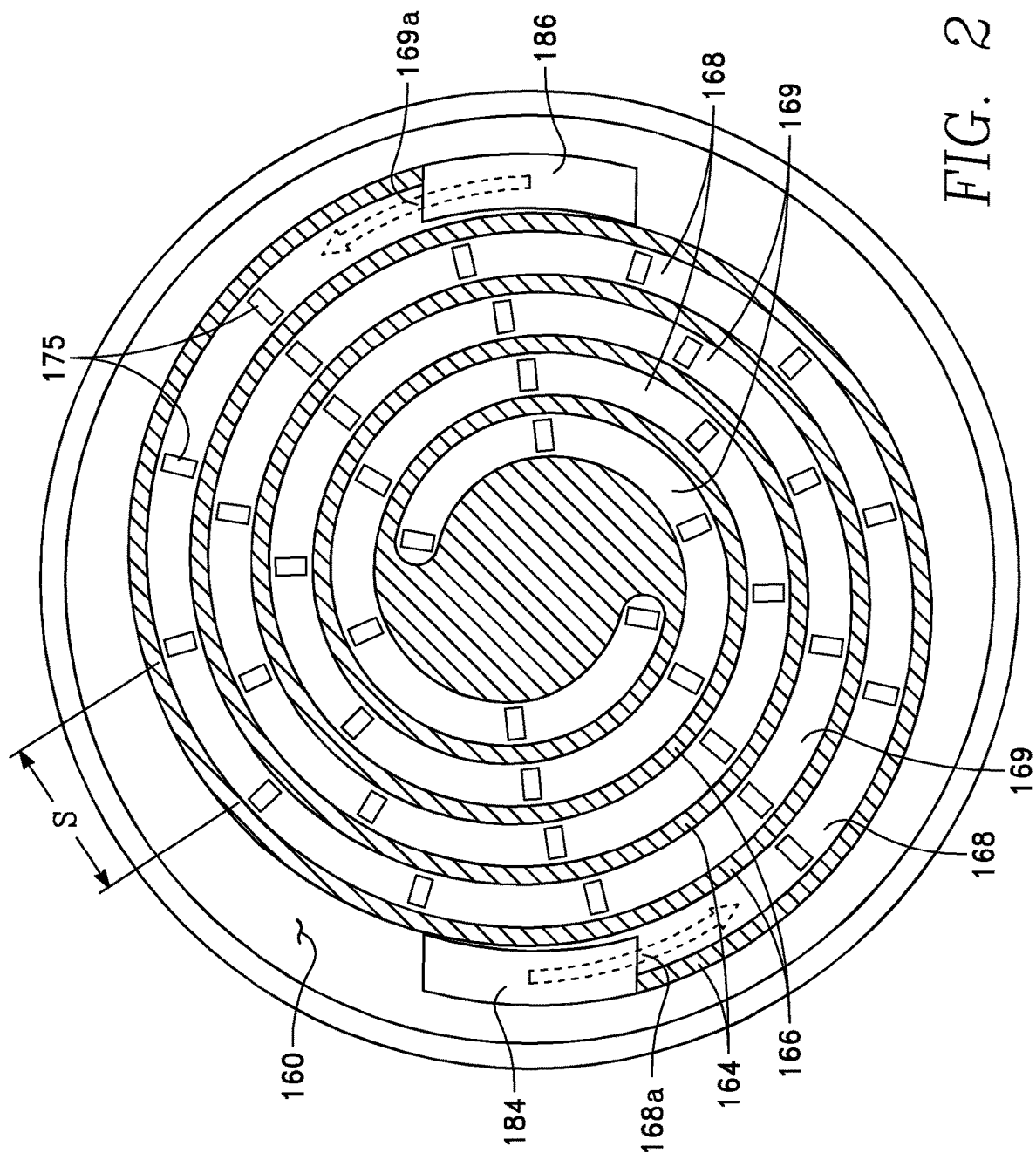
FIG. 2 is a cut-away plan view taken along line 2-2 of FIG. 1B.

Referring now to FIGS. 1A and 1B, a workpiece processing reactor includes a chamber 100 containing a workpiece support 102. The chamber 100 is enclosed by a side wall 104 and a ceiling 106 formed of a microwave transparent material such as a dielectric material. In one embodiment, the ceiling 106 may be implemented as a dielectric window 108 formed in the shape of a disk. A rotating microwave antenna 114 overlies the dielectric window 108. The microwave antenna 114 is enclosed by a conductive shield 122 consisting of a cylindrical side wall 124 and a disk-shaped cap 126. In one embodiment depicted in FIG. 2, the microwave antenna 114 is disk-shaped.

As shown in FIG. 1A, the microwave antenna 114 is fed by an axial waveguide 116. The axial waveguide 116 is coupled through an overlying rotary microwave coupling 118 to a stationary microwave feed 120. The rotary coupling 118 includes a stationary member 118-1 and a rotatable member 118-2. The stationary member 118-1 is stationary relative to the chamber 100 and is connected to the microwave feed 120. The rotatable member 118-2 is connected to the axial waveguide 116 and has an axis of rotation coinciding with the axis of symmetry 114a of the microwave antenna 114. The rotary microwave coupling 118 permits microwave energy to flow from the stationary member 118-1 to the rotatable member 118-2 with negligible loss or leakage. As one possible example, a slip-ring RF seal (not shown) may be placed at the interface between the stationary and rotatable members 118-1 and 118-2.

A rotation actuator 140 is stationary relative to the chamber 100 and includes a rotation motor 140-1 and a rotating drive gear 140-2 driven by the rotation motor 140-1. A driven gear 118-3 bonded or fastened to the rotatable member 118-2 is engaged with the drive gear 140-2, so that the motor 140-1 causes rotation of the rotatable member 118-2 about the axis of symmetry 114a. The driven gear 118-3 may be implemented, for example, as a circular array of teeth on the bottom surface of the rotatable member 118-2.

In one embodiment, a gas distribution plate (GDP) 144 is disposed beneath the ceiling 106, and has an array of gas injection orifices 145 extending through it and receives process gas from a process gas supply 147.

As shown in FIG. 1A, a remote microwave source or generator 150 is coupled to the rotary coupling 118 by the microwave feed 120.

The microwave antenna 114 is depicted in detail in FIGS. 1B through 4, and includes an antenna floor 160, an antenna ceiling 162, and a pair parallel spiral waveguide side walls 164, 166 extending between the floor 160 and the ceiling 162. The pair of parallel spiral waveguide side walls 164, 166 form a pair of parallel spiral waveguide cavities 168, 169. In the illustrated embodiment, the pair of parallel spiral waveguide cavities 168, 169 form spirals of Archimedes, in which the radius of each spiral increases with the angle of rotation. Small slots 175, or openings through the antenna floor 160, serve as microwave radiation ports and are disposed at locations periodically spaced along the length of each spiral waveguide cavity 168, 169. The slots 175 may be of any suitable shape and have an opening size, in one embodiment, a small fraction (e.g., one tenth or less) of a wavelength of the microwave generator 150. In one embodiment, the distance S between neighboring slots 175 along the length of each spiral conduit 168, 169 is a fraction (e.g., about one-half) of a wavelength of the microwave source 150. Microwave energy radiates through the slots 175 into the chamber 100. A pair of feed openings 180, 182 in the ceiling 162 are disposed on opposing sides of the axis of symmetry 114*a* and provide respective paths for microwave energy to be fed into firespective peripheral (radially outward) open ends 168*a*, 169*a* of the spiral waveguide cavities 168, 169. The peripheral open ends 168*a*, 169*a* are displaced from one another by an angle of 180 degrees along the periphery of the microwave antenna 114. Likewise, the pair of feed openings 180, 182 are displaced from one another by an angle of 180 degrees along the periphery of the microwave antenna 114.

Figure 3:
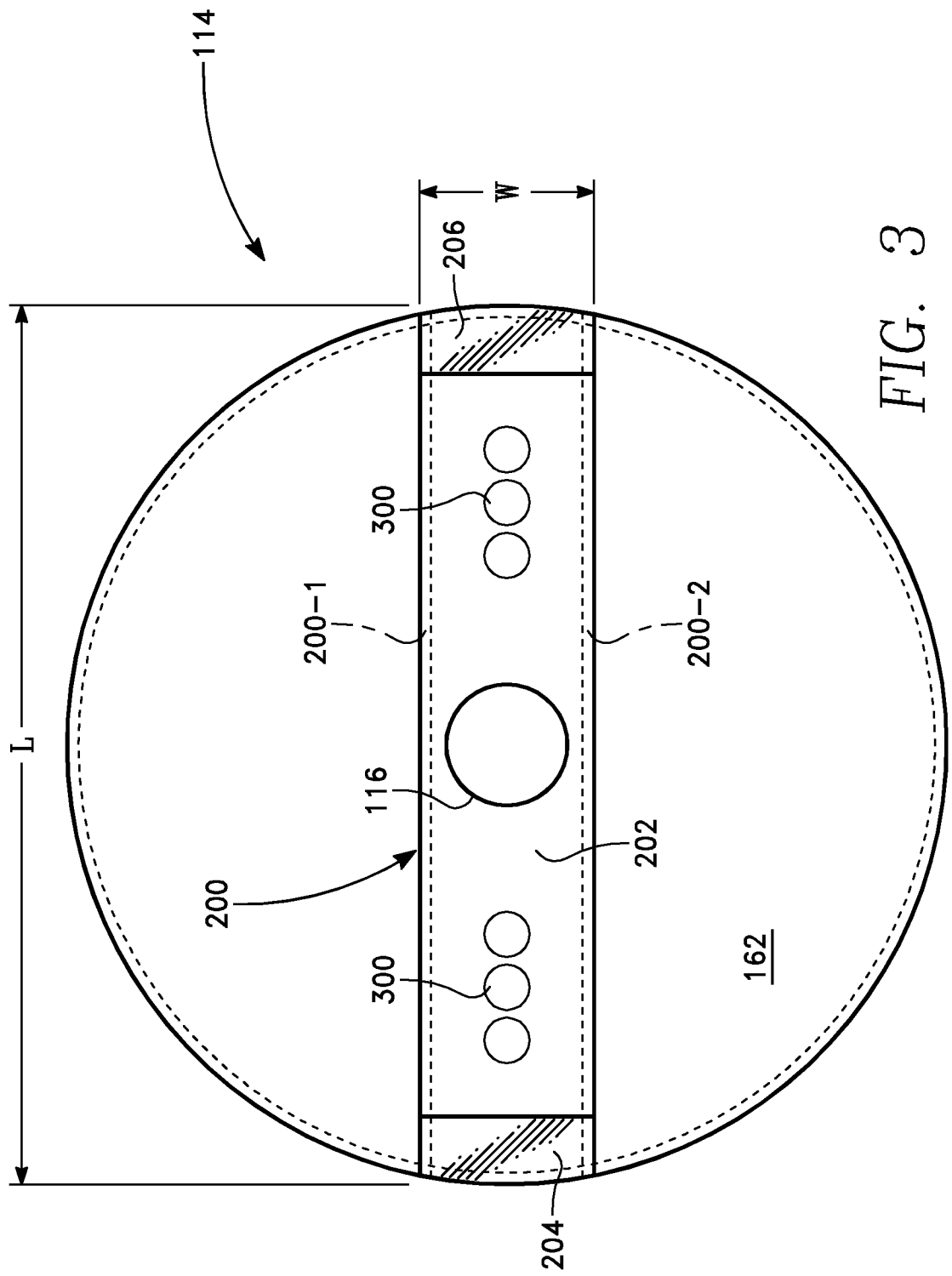
FIG. 3 is a plan view of the embodiment of FIG. 1B.
Figure 4:
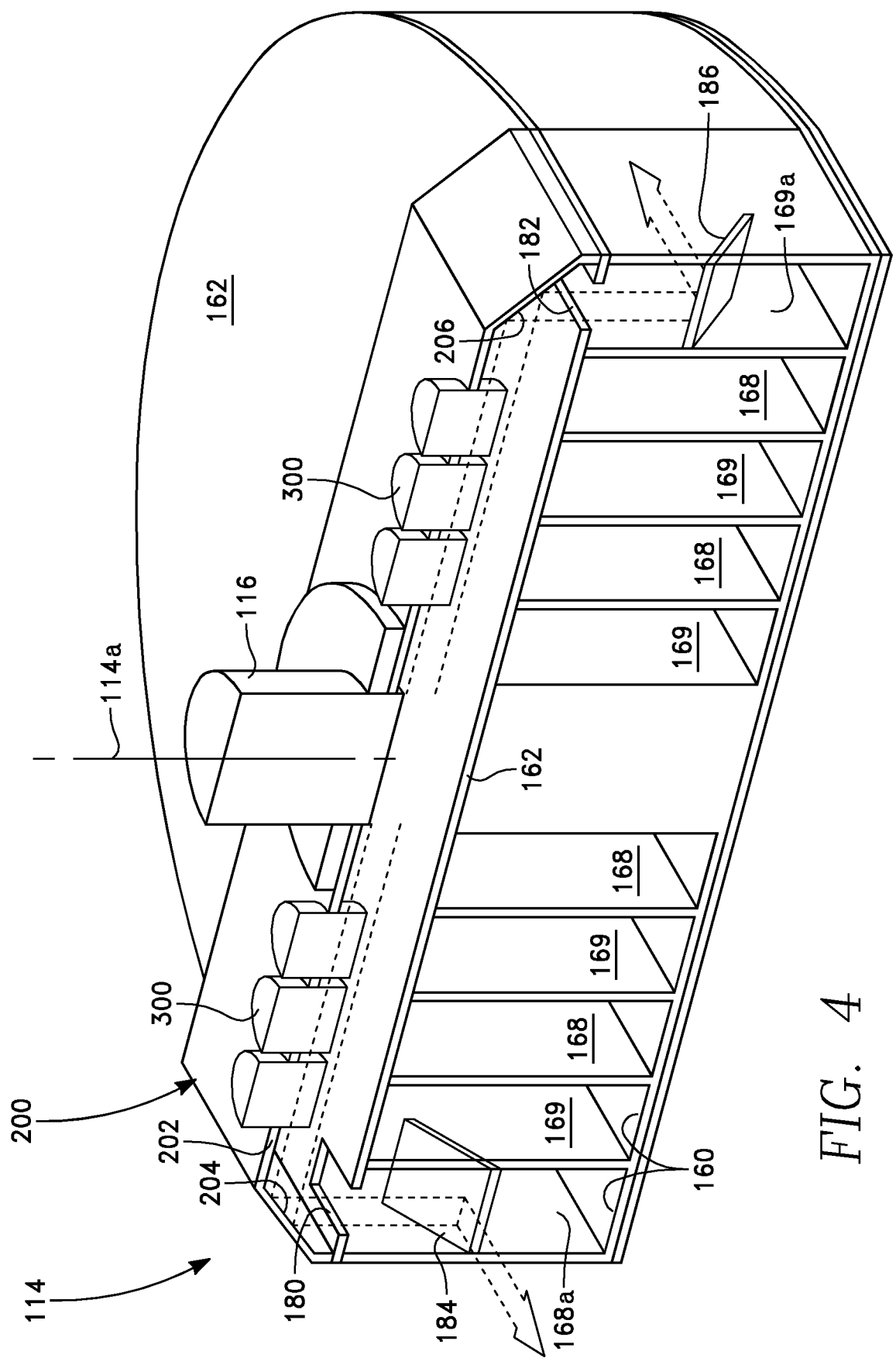
FIG. 4 is a cut-away orthographic projection corresponding to FIG. 3.

A distributor waveguide 200 depicted in FIGS. 3 and 4 overlies the ceiling 162 and distributes microwave energy through chamber portions that extend linearly and radially from the axial waveguide 116 to the pair of feed openings 180, 182. The distributor waveguide 200 includes a waveguide top 202 overlying and facing the ceiling 162 and a pair of slanted end walls 204, 206 extending between the waveguide top 202 and the ceiling 162. The pair of slanted end walls 204, 206 reflect microwave energy flowing radially within the distributor waveguide 200 to flow axially into the feed openings 180, 182 respectively. A first slanted reflector surface 184 in registration with the feed opening 180 is disposed at an angle (e.g., 45 degrees) relative to the axis of symmetry 114*a*. A second slanted reflector surface 186 in registration with the feed opening 182 is disposed at an angle (e.g., 45 degrees) relative to the axis of symmetry 114*a*. The first and second slanted reflector surfaces 184, 186 reflect microwave energy flowing axially from the feed openings 180, 182 to flow azimuthally through the spiral waveguide cavities 168, 169 respectively. In one embodiment, the length of each of the slanted surfaces 184, 186, 204, 206 along the direction of wave propagation is one-quarter wavelength of the microwave generator 150. The slanted surfaces 184, 186, 204, 206 may be referred to as reflective surfaces.

Referring to FIG. 3, the distributor waveguide 200 has a length L corresponding to the diameter of the chamber 100, and a width W of several inches, in one embodiment. Axial flat side walls 200-1, 200-2 along the length L enclose the interior of the distributor waveguide 200. The height of the side walls 200-1, 200-2 corresponds to the distance between the ceiling 162 and the waveguide top 202. In one embodiment, this distance may be on the order one or a few inches. Optionally, plural microwave stub tuners 300 are placed at periodic locations along the length of the distributor waveguide 200.

An advantage of the embodiments of FIGS. 1B-4 is that microwave energy is uniformly distributed along the lengths of each spiral waveguide cavity 168, 169, so as to radiate in uniformly distributed intervals corresponding to the periodic locations of the slots 175. A further advantage is that power distribution among the pair of spiral waveguide cavities 168, 169 can be balanced by adjustment of the plural stub tuners 300.

While the foregoing is directed to embodiments of the present invention, other and further embodiments of the invention may be devised without departing from the basic scope thereof, and the scope thereof is determined by the claims that follow.

What is claimed is:

1. A reactor for processing a workpiece comprising:
   a chamber and a workpiece support surface in said chamber;
   a rotary coupling comprising a stationary stage and a rotatable stage having an axis of rotation;
   a microwave source coupled to said stationary stage;
   a rotation actuator;
   a microwave antenna coupled to said rotation actuator and overlying said chamber, said microwave antenna comprising:
      a floor and a ceiling defining a planar region therebetween;
      a first spiral wall extending between said floor and said ceiling and having a spiral axis corresponding to said axis of rotation, said first spiral wall defining a first spiral conduit that spirals radially inwardly making at least a revolution around said spiral axis in the planar region from a first conduit end to a second conduit end such that microwave energy fed into said first spiral conduit flows azimuthally in the planar region through the first spiral conduit;
      first plural ports in said floor spaced apart along the length of said first spiral conduit;
      a distributor waveguide positioned above the ceiling and comprising an input and a first output coupled to said first spiral conduit; and
      an axial conduit coaxial with the axis of rotation, said axial conduit having a lower end coupled to the input of the distributor waveguide and an upper end coupled to said rotatable stage and configured to receive microwave energy from the microwave source through the rotary coupling while the rotation actuator causes the microwave antenna including the floor, ceiling, distributor waveguide and axial conduit to rotate.

2. The reactor of claim 1 wherein said microwave antenna further comprises:
   a second spiral wall extending between said floor and said ceiling and aligned with said spiral axis, said second spiral wall defining a second spiral conduit having a second conduit end, said second spiral conduit spiraling radially inward from the second conduit end making at least a revolution around said spiral axis in the planar region such that microwave energy fed into the second spiral conduit flows azimuthally in the planar region through the second spiral conduit;
   second plural ports in said floor spaced apart along the length of said second spiral conduit; and
   wherein said distributor waveguide further comprises a second output coupled to said second conduit end.

3. The reactor of claim 2 wherein said distributor waveguide comprises:
   a waveguide chamber overlying said microwave antenna and having respective openings aligned with respective ones of said first and second conduit ends; and
   a first pair of reflective surfaces angled to deflect radiation in said waveguide chamber into said respective openings.

4. The reactor of claim 3 wherein said microwave antenna further comprises:
   a second pair of reflective surfaces angled to deflect radiation from said respective openings to respective ones of said a first and second conduit ends.

5. The reactor of claim 4 wherein said second pair of reflective surfaces are oriented at 45 degrees relative to said spiral axis.

6. The reactor of claim 3 wherein said first pair of reflective surfaces are oriented at 45 degrees relative to said spiral axis.

7. The reactor of claim 3 wherein said first and second conduit ends are at a periphery of said microwave antenna, said distributor waveguide spanning a diameter of said microwave antenna.

8. The reactor of claim 7 wherein said respective openings are displaced from one another by 180 degrees along said periphery.

9. The reactor of claim 1, wherein the first output is coupled to the first spiral conduit at a position radially outward of the spiral axis.

10. A microwave antenna for a workpiece processing reactor, comprising: a floor and a ceiling defining a planar region therebetween;
 a plurality of spiral walls defining a plurality of spiral conduits and extending between said floor and said ceiling, wherein each spiral conduit of the plurality of spiral conduits spirals radially inward in the planar region about making at least a revolution around a spiral axis from a first conduit end to a second conduit end such that microwave energy fed into each spiral conduit flows azimuthally in the planar region;
 plural ports in said floor spaced apart along the length of each spiral conduit;
 an axial conduit that is coaxial with the spiral axis; and
 a distributor waveguide positioned between the ceiling and the axial conduit and comprising an input located at the spiral axis and coupled to said axial conduit, a plurality of waveguide chamber portions extending linearly and radially outward from the input, and a plurality of outputs positioned at radially outward ends of the waveguide chamber portions, each respective output of the plurality of outputs coupled to a respective spiral conduit from the plurality of spiral conduits at a position radially outward of the spiral axis.

11. The antenna of claim 10 further comprising:
 a rotary coupling comprising a stationary stage and a rotatable stage having an axis of rotation coinciding with said spiral axis;
 a microwave source coupled to said stationary stage, said axial conduit coupled to said rotatable stage; and
 a rotation actuator coupled to said rotatable stage.

12. The antenna of claim 10 wherein said distributor waveguide comprises:
 a first pair of reflective surfaces angled to deflect radiation in said waveguide chamber into said respective outputs.

13. The antenna of claim 12 further comprising:
 a second pair of reflective surfaces angled to deflect radiation from said respective outputs to respective ones of said first and second conduit ends.

14. The antenna of claim 13 wherein said second pair of reflective surfaces are oriented at 45 degrees relative to said spiral axis.

15. The antenna of claim 13 wherein said first and second conduit ends are one opposite sides of a periphery of said axial conduit.

16. The antenna of claim 15 wherein said respective outputs are displaced from one another by 180 degrees along said periphery.

17. The antenna of claim 12 wherein said first pair of reflective surfaces are oriented at 45 degrees relative to said spiral axis.

18. The antenna of claim 10, wherein each respective output of the plurality of outputs is coupled to the first conduit end of the respective spiral conduit.

19. A reactor comprising:
 a workpiece processing chamber;
 a first planar spiral waveguide conduit overlying said workpiece processing chamber and having a spiral axis and a first conduit end, said first planar spiral waveguide conduit spiraling radially inward from the first conduit end and making at least a revolution around said spiral axis such that microwave energy fed into the first spiral conduit flows azimuthally through the first spiral conduit;
 first plural ports in said first spiral waveguide conduit facing said workpiece processing chamber and spaced apart along the length of said first spiral waveguide conduit;
 an axial conduit configured to receive microwave energy; and
 a distributor waveguide comprising an input coupled to output of said axial conduit and a first output coupled to said first conduit end of said first planar spiral waveguide.

20. The reactor of claim 19 further comprising:
 a rotary coupling comprising a stationary stage and a rotatable stage having an axis of rotation coinciding with said spiral axis;
 a microwave source coupled to said stationary stage, said axial conduit coupled to said rotatable stage; and
 a rotation actuator coupled to said rotatable stage.

21. The reactor of claim 20 further comprising:
 a second planar spiral waveguide conduit aligned with said spiral axis, said second spiral conduit having a second conduit end; said second planar spiral waveguide conduit spiraling radially inwardly from the second conduit end and making at least one revolution about around said spiral axis such that microwave energy fed into the second spiral conduit flows azimuthally through the second spiral conduit;
 second plural ports in said second spiral waveguide conduit spaced apart along the length of said second spiral conduit; and
 wherein said distributor waveguide further comprises a second output coupled to said second conduit end.

* * * * *